United States Patent
Blaszczak et al.

(10) Patent No.: US 6,873,060 B2
(45) Date of Patent: Mar. 29, 2005

(54) ELECTRONIC COMPONENT WITH A SEMICONDUCTOR CHIP, METHOD OF PRODUCING AN ELECTRONIC COMPONENT AND A PANEL WITH A PLURALITY OF ELECTRONIC COMPONENTS

(75) Inventors: Stephan Blaszczak, Freyburg (DE); Martin Reiss, Regensburg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/396,841

(22) Filed: Mar. 25, 2003

(65) Prior Publication Data

US 2003/0218263 A1 Nov. 27, 2003

(30) Foreign Application Priority Data

Mar. 25, 2002 (DE) .......................... 102 13 296

(51) Int. Cl.[7] .............................................. H01L 23/28
(52) U.S. Cl. ...................... 257/787; 257/678; 257/792; 257/793; 257/794
(58) Field of Search ................................ 257/787, 678, 257/792, 793, 794; 438/127; 361/777

(56) References Cited

U.S. PATENT DOCUMENTS

| | | | | |
|---|---|---|---|---|
| 4,763,409 A | * | 8/1988 | Takekawa et al. | 29/827 |
| 5,666,008 A | * | 9/1997 | Tomita et al. | 257/678 |
| 5,855,821 A | * | 1/1999 | Chau et al. | 252/514 |
| 5,894,984 A |   | 4/1999 | Sakai et al. |  |
| 6,309,916 B1 | * | 10/2001 | Crowley et al. | 438/127 |

FOREIGN PATENT DOCUMENTS

WO 99/18609 4/1999

* cited by examiner

Primary Examiner—Jasmine Clark
(74) Attorney, Agent, or Firm—Laurence A. Greenberg; Werner H. Stemer; Gregory L. Mayback

(57) ABSTRACT

The electronic component has a semiconductor chip embedded in a plastic compound. The electronic component is produced by first producing a number of electronic components on a panel and subsequent dicing into single electronic components. The semiconductor chip of this component is disposed on a substrate the includes or is entirely formed of plastic and it is embedded in a plastic package molding compound. The plastic of the substrate has a glass transition temperature range which is lower than the glass transition temperature range of the plastic package molding compound.

17 Claims, 3 Drawing Sheets

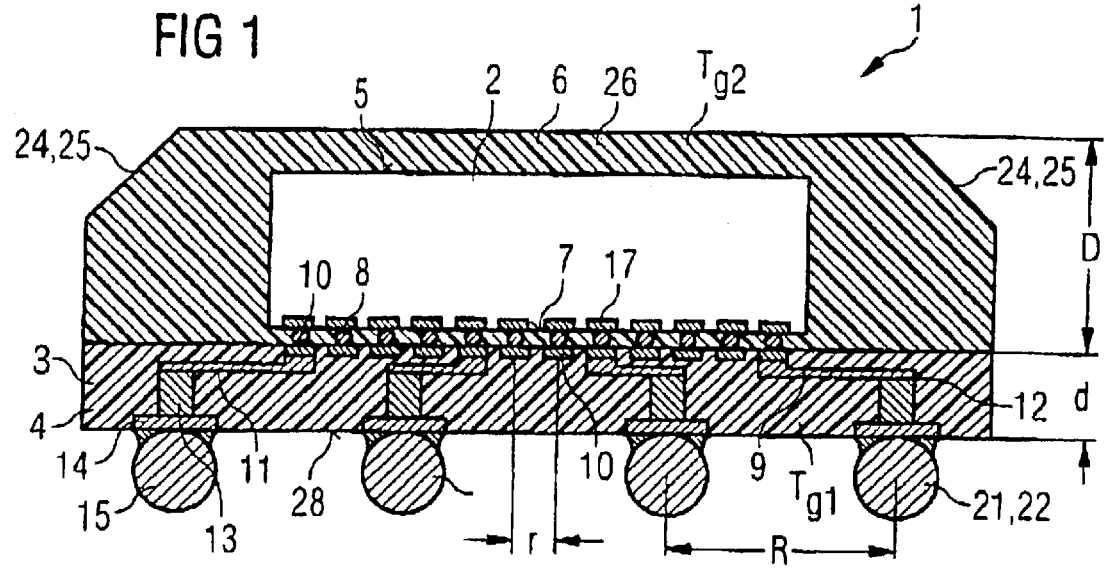
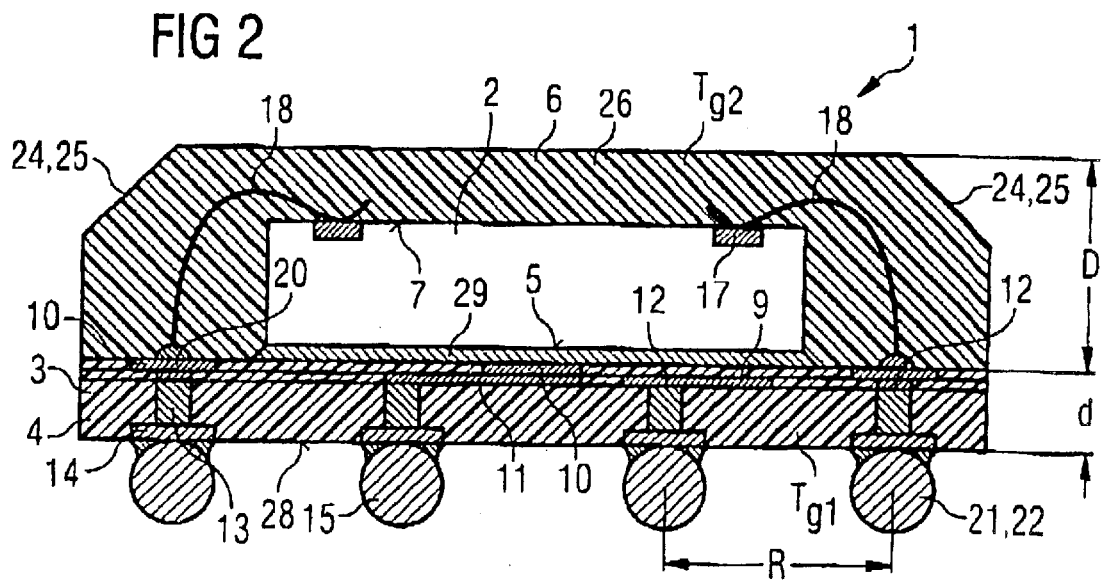

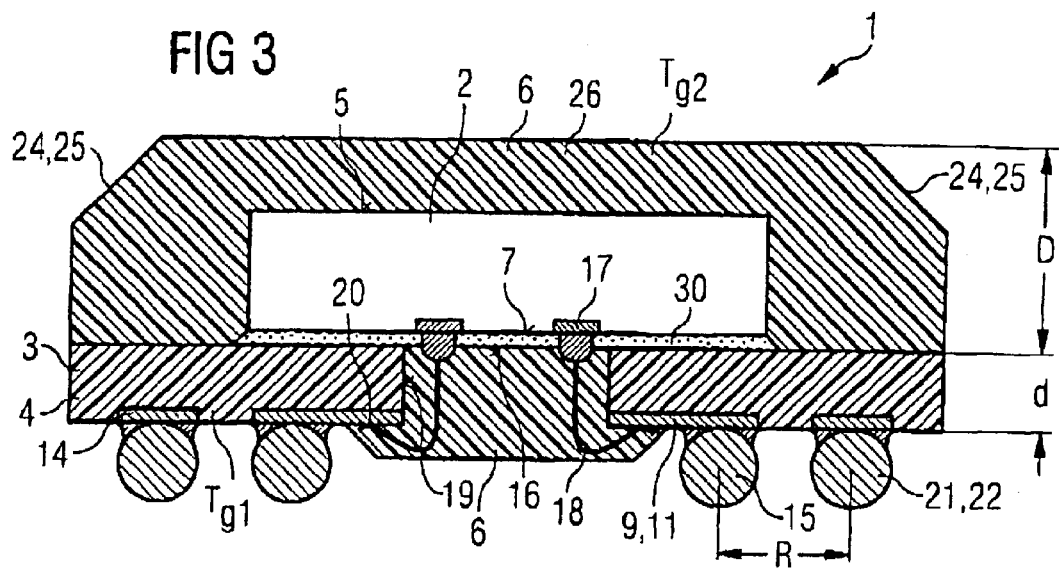
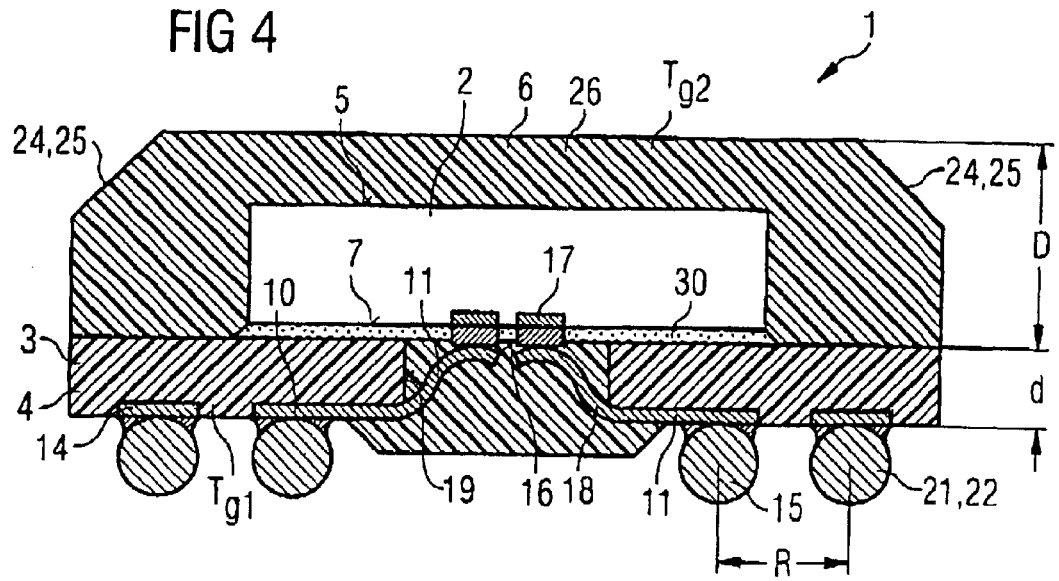

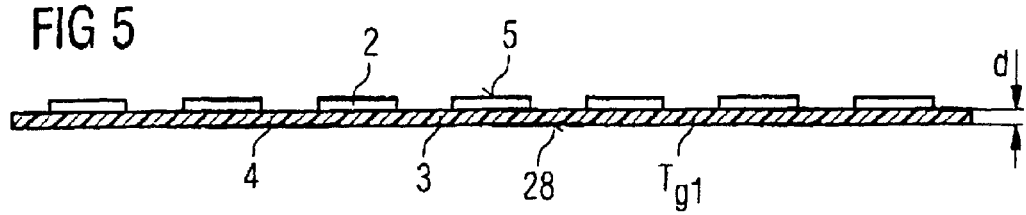
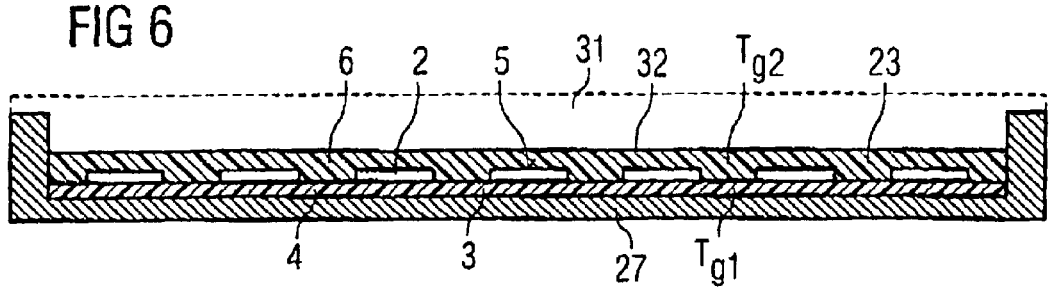
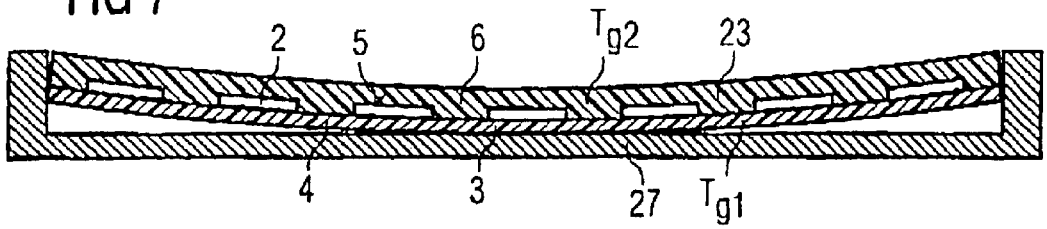
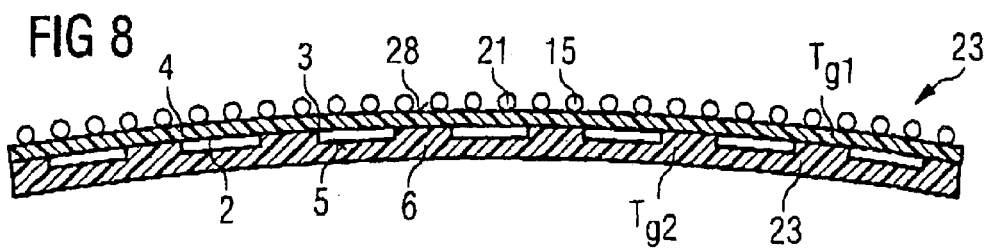
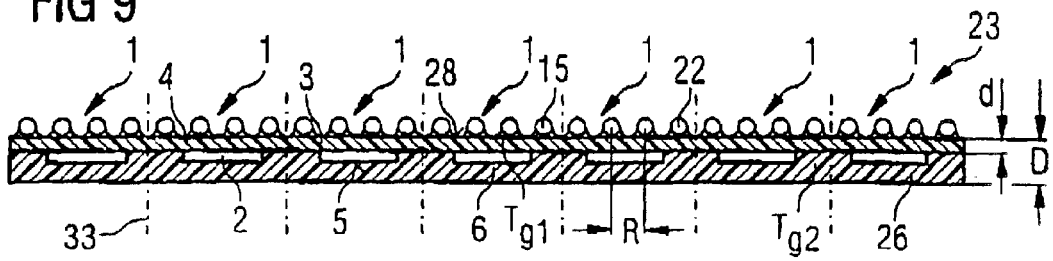

ELECTRONIC COMPONENT WITH A SEMICONDUCTOR CHIP, METHOD OF PRODUCING AN ELECTRONIC COMPONENT AND A PANEL WITH A PLURALITY OF ELECTRONIC COMPONENTS

BACKGROUND OF THE INVENTION

Field of the Invention

The invention relates to an electronic component with a semiconductor chip and to a method of producing a panel for a number of such electronic components and to a method of producing such a component of the generic type.

During the injection-molding of plastic package molding compounds or the application of a plastic package molding compound to protect a passive rear side of a semiconductor chip, the plastic package molding compound is applied to one side of a substrate which is loaded with semiconductor chips and is structured and formed as a wiring board for the semiconductor chips, thereby forming a panel. When the plastic encapsulating compound solidifies, it shrinks to a greater extent than the shape-defining, not pre-heated substrate. As a result, bowing may occur on account of the thermally induced stresses.

Such instances of bowing or distortion of a panel for a number of electronic components make them appear unusable for further processing, for which reason the panel must be segregated and is discarded when it exceeds a limited degree of deformation. To minimize the instances of bowing after the plastic package molding compound has been applied to the substrate, substrates which are extremely rigid and provide a planar intermediate product with applied plastic package molding compound for the subsequent method steps are used. One disadvantage of this combination of an extremely rigid substrate or extremely rigid wiring board and an applied plastic package molding compound is the great expenditure of material, since the substrate must have a minimum thickness in order to absorb the thermal stresses with minimally permissible bowing. Furthermore, there is always the risk of delamination between the plastic package molding compound and the substrate for a panel constructed on a rigid substrate.

SUMMARY OF THE INVENTION

It is accordingly an object of the invention to provide an electronic component with a semiconductor chip and a panel and component production method which overcome the above-mentioned disadvantages of the heretofore-known devices and methods of this general type and which provides for an electronic component with a semiconductor chip in which the volume of the substrate can be reduced as much as desired in comparison with the volume of the plastic package molding compound and any bowing originating from intermediate products such as a panel comprising a substrate and plastic package molding compound for electronic components can be tolerated without potentially compromising the planarity of the end product in the form of an electronic component.

With the foregoing and other objects in view there is provided, in accordance with the invention, an electronic component, comprising:

a substrate formed with plastic (consisting of plastic or containing plastic);

a semiconductor chip disposed on the substrate;

a plastic package molding compound embedding the semiconductor chip; and the plastic of the substrate having a glass transition temperature range below a glass transition temperature range of the plastic package molding compound.

In other words, the invention provides an electronic component with a semiconductor chip, which is disposed on a substrate comprising plastic and is embedded in a plastic package molding compound. In the case of the electronic component, the plastic of the substrate has a glass transition temperature which is lower than the glass transition temperature of the plastic package molding compound.

The electronic component has the advantage that the substrate can be made as thin as desired and does not have to have any dimensionally stabilizing effect, since the dimensional stability and the planarity of the electronic component are ensured by the plastic package molding compound with its higher glass transition temperature range. The dimensionally stabilizing component is no longer the substrate material, with the result that the latter can be reduced in its thickness to make it as thin as desired, to below film thickness, without potentially compromising the planarity of the electronic component. The risk of delamination between the substrate and the plastic package molding compound is also consequently reduced.

The plastic of the substrate may comprise a glass-fiber-reinforced epoxy resin with a polymer additive. In the epoxy resin, which forms a thermosetting material, this polymer additive has the effect of forming a limited glass transition temperature range, which occurs in a very narrow temperature interval of a few degrees Celsius and softens the substrate in this glass transition temperature range, with the result that the plastic of the substrate softens without decomposing.

Consequently, the substrate material has the capability of adapting itself to the given shapes and aligning itself in a planar manner under gravity on a corresponding planar underlying surface.

The plastic of the substrate may have a glass transition temperature range of from 165° C. to 175° C. At these temperatures, the plastic of the substrate does not decompose and the material does not become stiff, but instead tends to be moldable and can assimilate to given planar surfaces.

In accordance with an added feature of the invention, the glass transition temperature range of the plastic package molding compound lies above 175° C. As a result, the plastic package molding compound is shape-determining when the plastic of the substrate and the plastic package molding compound are heated simultaneously. The glass transition temperature range of the plastic package molding compound can be influenced by additions of filling material.

The filling material provides not only a correspondingly high glass transition temperature range of the plastic package molding compound, but also mechanical strength and the setting of different flow properties of the plastic package molding compound.

To achieve the effect that the plastic package molding compound has a glass transition temperature range above 170° C., a filling material is added to the plastic package molding compound in the order of magnitude of at least 60% by volume. The range for the filling material is preferably 75 to 85% by volume. This allows the effect to be achieved that the glass transition temperature range of the plastic package molding compound lies distinctly above the glass transition temperature range of the plastic of the substrate.

With homogeneous distribution of the filling material in the plastic package molding compound, the effect can be achieved that the plastic package molding compound has a constant coefficient of thermal expansion in the X, Y and Z directions, which may lie between 10 and 60 ppm/° C.

The glass fiber reinforcement of the substrate has the effect that the thermal expansion properties of the substrate are anisotropic, with the result that a lower coefficient of thermal expansion prevails in the X and Y directions, in which glass fiber mats of the substrate act, than in the Z direction, in which no glass fibers are oriented. Consequently, a coefficient of thermal expansion of from 5 to 15 ppm/° C. can prevail in the X and Y directions, while the coefficient of thermal expansion typical of plastic molding compounds of between 10 and 60 ppm/° C. prevails in the Z direction. The difference in the coefficient of thermal expansion of the plastic with glass fiber reinforcement of the substrate and of the plastic package molding compound in the X and Y directions has the effect when a molten plastic package molding compound for embedding the semiconductor chips is applied to a not pre-heated solid glass-fiber-reinforced substrate that the composite assembly made up of the plastic package molding compound and the substrate bows distinctly, especially if the substrate is minimized in its thickness.

The bowing is brought about essentially by the greater shortening in the length of the plastic package molding compound in the X and Y directions. In spite of such a dome-like bowing, a completely planar electronic component can be presented, if for example the glass transition temperature range is exceeded for both plastic components of the substrate and of the plastic package molding compound, for example in a high-temperature solder melting process, which takes place at temperatures between 200 and 250° C. In this case, a planar underlying surface is sufficient to realize a completely planar electronic component by gravity alone with the combination of the substrate material and plastic package molding compound, in spite of previous bowing seemingly indicating rejection. Consequently, matching adjustment and the provision of a glass transition temperature range for the substrate which is lower than the glass transition temperature range of the plastic package molding compound are decisive for producing perfect electronic components.

The proportion by volume of the substrate in the total volume and the proportion by volume of the plastic package molding compound in the total volume should be in a ratio to each other of at least 1:3. Such a ratio ensures that the plastic package molding compound with its higher glass transition temperature range compared to the plastic of the substrate determines the planarity of the electronic component. At the same time, this ratio shows the possibility of further reducing the proportion by volume of the substrate and consequently minimizing the overall dimensions of the electronic component. The combination according to the invention of a low glass transition temperature range for a substrate or a wiring board and a high glass transition temperature range for a plastic package molding compound of an electronic component can be used for different embodiments of electronic components.

In one of the embodiments, the semiconductor chip has on its active upper side flip-chip contacts, which are electrically connected to a wiring pattern on the substrate. In the case of this embodiment of the invention, the passive rear side of the semiconductor chip can be covered with plastic package molding compound and the substrate with the wiring pattern can be made extremely thin, since, on account of the higher glass transition temperature range of the plastic package molding compound, the planarity of the component is determined by the plastic package molding compound. In the case of this embodiment of the invention, the wiring pattern on the substrate has contact terminal areas, wiring lines and contact transition areas to contact vias.

The contact vias are electrically in connection with external contact areas, the external contact areas having macroscopically large external contacts, which protrude from the electronic component on its underside. Macroscopically large is understood in this context as meaning dimensions which are visible and measurable with the naked eye and lie in the millimeter range. The contact terminal areas of the wiring pattern are arranged in such a way that they they can be connected directly to the flip-chip contacts of the semiconductor chip. This connection may be realized by means of microscopically small solder balls, which are arranged on the microscopically small contact areas of the semiconductor chip as flip-chip contacts. Microscopically small is understood in this context as meaning components of which the dimensions can be perceived and measured only under an optical microscope.

Instead of a connection by means of microscopically small solder balls, a surface-area contact is also possible, microscopically small terminal areas being provided both on the substrate in the framework of the wiring pattern and on the semiconductor chip. The surface-area contacts have an order of magnitude of a few 10 s of micrometers, and form diffusion-brazed joints with intermetallic phases and consequently permit a surface-area, microscopically small electrical connection between contact areas of the semiconductor chip and corresponding contact terminal areas of the wiring pattern on the substrate.

With such a design of the invention, it is advantageous that the coefficient of expansion in the X and Y directions of the substrate lies in the range of 5 ppm/° C. on account of the glass fiber reinforcement, since this coefficient of expansion is adapted well to the coefficient of expansion of the semiconductor chip, in particular a semiconductor chip made of silicon. Packaging a substrate that is thermally adapted so well to the semiconductor chip in a plastic package molding compound, which has a coefficient of thermal expansion of between 10 and 60 ppm/° C. isotopically in all spatial directions, brings about a considerable bowing of the composite assembly made up of the plastic package molding compound and the substrate material. However, this bowing is absorbed and compensated when macroscopically large external contacts are applied to the surface of the substrate opposite the semiconductor chip. Macroscopically large means in this context that the type of the external contacts can be perceived with the naked eye and the dimensions and grid spacing can be measured with the naked eye. In spite of the bowing of the electronic component, initially suggesting rejection, this component will have completely planar outer faces after the melt-soldering of the external contacts on the external contact areas, on account of the matching of the glass transition temperature ranges of the substrate and the plastic package molding compound.

In accordance with an additional feature of the invention, the semiconductor chip is fixed with its passive rear side on the substrate, and the contact areas of the chip are connected to a wiring pattern on the substrate by means of bonding wires. The wiring pattern has contact terminal areas on which the bonding wires are bonded, and wiring lines which lead to contact transition areas, which are in connection with contact vias to the opposite face of the substrate. It is also the case in this embodiment of the invention that the microscopically small contact areas of the semiconductor chip are electrically connected to the macroscopically large external contacts of the electronic component by means of contact vias through the substrate.

In accordance with another feature of the invention, the substrate has no contact vias, but a bonding channel opening. The semiconductor chip is fixed on its active upper side on the substrate and positioned in such a way that its contact areas are arranged within the bonding channel of the substrate. The wiring structure in the case of this embodiment of the invention is arranged on the side of the external contacts, the external contacts being arranged on external contact areas and being connected to bonding fingers on the edge of the bonding channel opening by means of wiring lines. These bonding fingers are connected to the contact areas of the semiconductor chip in the bonding channel opening by means of bonding wires. In this way, microscopically small contact areas of the semiconductor chip are electrically connected by means of the bonding channel opening in the substrate over macroscopically large external contact areas and the external contacts of the electronic component.

Instead of bonding wire connections, flat conductor connections may also be provided, the flat conductors representing wiring lines of the wiring pattern which extend into the bonding channel opening and are electrically connected to the contact areas of the semiconductor chip. It is also the case in this embodiment of the invention that the substrate has no contact vias, but instead an initially open bonding channel opening, which is to be filled with plastic package molding compound before or at the same time as the embedding of the semiconductor chips in plastic package molding compound. Since the plastic package molding compound on the rear side of the semiconductor chips has a higher proportion by volume than the plastic package molding compound in the bonding channel openings, the plastic package molding compound on the rear side of the semiconductor chips remains decisive for the planarity of the electronic component. With the ratio according to the invention of the glass transition temperature ranges between the substrate and the plastic package molding compound, the effect is achieved that the component is leveled during the melt-soldering of the external contacts and has completely planar outer faces after it has cooled down.

The external contacts themselves may be formed as macroscopically large solder balls and/or as contact bumps. This has the advantage that the electronic component can be attached and positioned on a superordinate circuit carrier by relatively simple means. For this purpose, the external contacts may be arranged in rows and columns in a predetermined grid spacing in a two-dimensional matrix. This has the advantage that the complete outer face of the substrate apart from a possible bonding channel region is available for external contacts to be arranged, whereby it is possible to accommodate a high number of external contacts on a substrate.

With the above and other objects in view there is also provided, in accordance with the invention, a method of producing a panel with a plurality of electronic components each having a semiconductor chip. The method comprises the following method steps:

providing a substrate formed with plastic and loaded and wired with a plurality of semiconductors;

applying a plastic package molding compound to one side of the substrate, thereby embedding the semiconductor chips in the plastic package molding compound and causing a bowing of the substrate and the plastic package molding compound, forming a bowed panel;

positioning solder balls on the bowed panel;

melt-soldering the solder balls on the panel, thereby leveling the panel to form a leveled panel; and cooling down the leveled panel and cooling below the glass transition temperature of the plastic package molding compound and thereafter cooling below a glass transition temperature of the plastic of the substrate.

In other words, the method of producing an electronic component firstly comprises a method of simultaneously producing a panel for a number of electronic components which respectively have a semiconductor chip, this method of producing a panel having the following method steps:

Firstly, a substrate which is loaded with a number of semiconductors and wired is provided. Subsequently, a plastic package molding compound is applied to one side of the substrate, with the semiconductor chips being embedded in the plastic package molding compound. As this happens, the panel comprising the substrate and the plastic package molding compound bows considerably, and far beyond the permissible degree for operational electronic components. On the bowed, seemingly unusable, panel, solder balls are positioned on the outer side of the substrate.

When the panel is heated to the temperature for melt-soldering of the solder balls, the panel is leveled under its own weight on account of the temperature, with the result that a planar panel with conductor tracks is obtained. After the leveled panel has cooled down by going below the glass transition temperature of the plastic package molding compound and thereafter going below the glass transition temperature of the substrate, a completely planar panel which has a number of electronic components is obtained.

Before the panel is separated into a number of individual electronic components, the panel may be initially pre-crosslinked or pre-cured and subsequently crosslinked or cured in two temperature stages below the lowest glass transition temperature of the plastic molding compounds. In this case, only the plastic molding compounds of the substrate and of the plastic package undergo curing.

For the pre-crosslinking of the plastic molding compounds, the panel may be heated from 30° C. or room temperature to 90° C. at a warming rate of 1° C./min. Subsequently, this temperature is maintained for 15 minutes. After this operation, the panel is pre-cured or the plastic pre-crosslinked, with the result that the panel can be transported and further processed without being damaged. The actual curing and final crosslinking of the plastic molding compounds is then carried out at temperatures of 150° C. for 60 minutes. This curing temperature also lies below the glass transition temperature ranges of the plastic molding compounds for the substrate and for the package, with the result that renewed bowing of the panel is ruled out.

For loading and wiring the substrate with a number of semiconductor chips before packaging in a plastic package molding compound, the flip-chip technique may be used, with either microscopically small solder balls or microscopically small area solders being used for area contacts or solid contacts. This method variant has the advantage that it connects and wires the semiconductor chip to the wiring board or the substrate with little expenditure and minimal volume requirement.

Apart from this preferred flip-chip technique, however, bonding techniques as mentioned above may also be used in order to load a number of semiconductor chips on the substrate and wire them. The application of a plastic package molding compound may be performed by applying a liquid plastic package molding compound to a not pre-heated substrate by means of injection-molding. This injection-molding technique applies a high pressure, in order to fill all the cavities between the substrate and the wired semiconductor chips. However, during the cooling down of the plastic package molding compound, the panel is deformed, in particular at the instant at which the panel is removed from the injection mold and the stresses between the substrate and the plastic package molding compound can take full effect.

Another possible way of applying the plastic package molding compound to a not pre-heated substrate is a printing technique, in which the plastic of the panel is applied with the aid of, for example, a screen printing process or a stencil printing process. After the plastic package molding compound has cooled down, a bowed panel with the outward appearance of not being suitable for further processing is obtained.

The positioning of solder balls on the bowed panel may be performed with the aid of a vacuum tool, which keeps the solder balls in position until they adhere on the pre-bowed panel in the intended positions. During the melt-soldering, which is carried out at 200–250° C., the panel is leveled on account of high temperature and its own weight and the solder balls are simultaneously fixed at their positions on the external contact areas of the wiring pattern of the substrate.

The cooling down of the leveled panel with soldered-on solder balls may take place at a cooling-down rate of greater than or equal to 1° C./min to less than or equal to 5° C./min. This cooling-down rate ensures that the glass transition temperature range of the plastic package molding compound is firstly passed through completely for the entire plastic package molding compound and only after that does the plastic of the substrate cool down to a temperature below its glass transition temperature range.

With the above and other objects in view there is also provided, in accordance with the invention, a method of producing individual electronic components. The method comprises the following method steps:

producing a panel with a plurality of electronic components as outlined above; and subsequently dicing the panel into individual electronic components to form a plurality of electronic components. Each of the resulting components has a semiconductor chip disposed on a substrate formed with plastic and embedded in a plastic package molding compound. The plastic of the substrate has a glass transition temperature range below a glass transition temperature range of the plastic package molding compound.

That is, in order to produce individual electronic components from the panel, the latter is separated into individual electronic components after the complete curing process for the plastic molding compounds, as described above. For this purpose, a sawing technique may be used, in which the separation of the panel directly produces a number of electronic components. With special profile setting of the saw blade, bevels can also be created on the four upper edges of the electronic component with one saw cut. Such bevels may have a bevel angle of 45°.

To sum up, the use of an encapsulating compound with a glass transition temperature range which is significantly higher than the glass transition temperature range of the substrate used can achieve the effect that the encapsulating compound to a great extent defines the bowing behavior on account of the greater proportion by mass of the package. Exceeding the glass transition temperature range of the encapsulating compound during the melt-soldering of the external contacts means that the leveled state of a panel is retained during cooling down, so that the planarity of a substrate strip with a number of semiconductor chips and electronic components is virtually enforced by the in the meantime solidified plastic package molding compound.

Other features which are considered as characteristic for the invention are set forth in the appended claims.

Although the invention is illustrated and described herein as embodied in an electronic component with a semiconductor chip, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic cross section through an electronic component of a first embodiment of the invention;

FIG. 2 is a schematic cross section through an electronic component of a second embodiment of the invention;

FIG. 3 is a schematic cross section through an electronic component of a third embodiment of the invention;

FIG. 4 is a schematic cross section through an electronic component of a fourth embodiment of the invention;

FIGS. 5–9 are sectional side views illustrating various method steps for simultaneously producing a number of electronic components of one of the four embodiments of the invention schematically represented in FIGS. 1–4, wherein FIG. 5 is the basic diagram of a substrate which is loaded with semiconductor chips and wired;

FIG. 6 is as a basic diagram the application of a molten plastic package molding compound to the not heated-up substrate loaded with semiconductors, for producing a panel;

FIG. 7 is a basic diagram of the panel after the plastic molding compounds of the substrate and plastic package have cooled down, before removal from a casting mold;

FIG. 8 is a basic diagram of the bowed panel after solder balls have been positioned at intended positions of the substrate; and FIG. 9 is a basic diagram of a panel for a number of electronic components which has been leveled during the melt-soldering of the solder balls to form external contacts.

DESCRIPTION OF THE PREFERRED EMBODIMENTS

Referring now to the figures of the drawing in detail and first, particularly, to FIG. 1 thereof, there is shown a schematic cross section through an electronic component 1 of a first embodiment of the invention. The reference numeral 2 identifies a semiconductor chip. The reference numeral 3 identifies a plastic of a substrate 4. The plastic 3 of the substrate 4 has a glass transition temperature range $T_{g1}$.

The semiconductor chip 2 has a passive rear side 5. A plastic package molding compound 6 completely covers the rear side of the semiconductor chip in this embodiment of the invention and embeds the semiconductor chip 2 in the plastic package molding compound 6 on one side of the substrate 4. The plastic package molding compound 6 has a glass transition temperature range $T_{g2}$.

In this embodiment of the invention, the glass transition temperature range $T_{g1}$ of the plastic 3 of the substrate 4 lies between 165 and 175° C. and is achieved by a polymer additive in an epoxy resin of the substrate 4. Apart from the plastic 3, the substrate 4 has a glass fiber mat, whereby the coefficient of thermal expansion of the substrate 4 in the X and Y directions is adapted to the coefficient of thermal expansion of the semiconductor chip 2.

It will be understood that the mutually orthogonal directions X, Y, and Z as used in this specification refer to the Cartesian coordinate system.

The semiconductor chip 2 in this embodiment of the invention consists of silicon with a coefficient of thermal expansion of approximately 4 ppm/° C. and the coefficient of thermal expansion of the glass-fiber-reinforced material has a value of approximately 5 ppm/° C. in the X and Y directions in this embodiment of the invention. Consequently, the microscopically small flip-chip contacts 8, which are connected to contact terminal areas 10 of a wiring pattern 9 on the substrate 4, are protected against being torn off, since the coefficient of thermal expansion of the semiconductor material and of the glass-fiber-reinforced substrate in the X and Y directions are approximately the same.

The reference numeral 7 identifies the active upper side of the semiconductor chip 2, with flip-chip contacts 8 arranged on it. The reference numeral 11 identifies wiring lines, which are connected on the one hand to the contact terminal areas 10 and on the other hand to contact transition areas 12 of the wiring pattern 9. The contact transition areas 12 form an electrical connection of the wiring pattern 9 to contact vias 13, which extend through the substrate 4 and are connected on the outer side 28 of the substrate 4 to external contact areas 14. These external contact areas 14 bear macroscopically large external contacts 15, which comprise either solder balls 21 or contact bumps 22.

The glass transition temperature range $T_{g2}$ of the plastic package molding compound 6 has higher temperatures than the glass transition temperature range $T_{g1}$ of the substrate. It is consequently ensured that, when the external contacts 15 are soldered on, which takes place at temperatures between 200 and 250° C., instances of bowing of the substrate 4 and of the plastic package molding compound 6 are compensated by the heavy weight of the plastic molding compounds, with the result that an electronic component 1 provided with planar upper sides can be provided. For this purpose, the proportion by volume of the plastic package molding compound 6 in relation to the proportion by volume of the plastic 3 of the substrate 4 is provided as at least 3:1, in order that the plastic package molding compound 6 is decisive for the planarity of the electronic component 1 during the melt-soldering of the solder contacts.

The plastic package 26 is formed with a 45° bevel 24 on its upper edges 25, which may be made for example when a panel is separated (diced) into the individual electronic component 1 shown here by a sawing operation using a profiled saw.

FIG. 2 shows a schematic cross section through an electronic component 1 of a second embodiment of the invention. Components with the same functions as in FIG. 1 are identified by the same reference numerals and are not separately explained.

The main difference between the embodiment of FIG. 1 and of FIG. 2 is that the semiconductor chip 2 is arranged with its passive rear side on the wiring structure. The rear side of the electronic component 1 may be connected by means of a solder layer 29 or by means of a conducting adhesive layer and the contact terminal area 10 and also the wiring lines 11 and the contact via 13 to an external contact 15, which is connected for example to the lowest switching potential for the semiconductor chip 2. The integrated circuit on the active upper side 7 of the semiconductor chip 2 is electrically connected by its contact areas 17 by means of bonding connections 18 to contact terminal areas 10 or to bonding fingers 20 of the wiring pattern 9 on the substrate. Consequently, the microscopically small contact areas 17 of the semiconductor chip 2 are electrically connected to the external contacts 15 by means of bonding connections 18, contact terminal areas 10 and contact vias 13. It is also the case in this embodiment of the invention that the semiconductor chip 2 wired to the substrate 4 is embedded in a plastic package molding compound 6, which has a higher glass transition temperature range $T_{g2}$ than the plastic 3 of the substrate 4.

FIG. 3 shows a schematic cross section through an electronic component 1 of a third embodiment of the invention. Components with the same functions as in the previous FIGS. are identified by the same reference numerals and are not separately explained.

The difference of the third embodiment in comparison with the embodiments of FIGS. 1 and 2 is that the substrate 4 has no contact vias. Rather, the substrate 4 of the third embodiment has a bonding channel opening 19, the semiconductor chip 2 being attached with its active upper side 7 on the substrate 4 by an insulating adhesive layer 30. The contact areas 17 of the electronic component 1 are arranged in the region of the bonding channel opening 19 of the substrate 4 on the active upper side 7 of the semiconductor chip 2. In this embodiment of the invention, the wiring pattern 9 of the substrate 4 is arranged on the side of the external contacts 15 and has in the edge region of the bonding channel opening 19 bonding fingers 20, from which bonding connections 18 lead to the contact areas 17 of the semiconductor chip 2.

The bonding channel region 16 with the bonding wires 18 in the bonding channel opening 19 is covered by a plastic package molding compound 6. This plastic package molding compound 6 may be applied to a not pre-heated substrate 4 before or at the same time as the plastic package molding compound 6 for covering the rear side 5 of the semiconductor chip 2. After the molten plastic package molding compound 6 has cooled down, the substrate 4 is initially bowed, on account of the higher coefficient of thermal expansion of the plastic package molding compound 6 than the coefficient of thermal expansion in the X and Y directions of the glass-fiber-reinforced substrate 4. However, during the melt-soldering of the external contacts 15 on the external contact areas 14, the entire component is heated to 200 to 250° C., with the result that both plastic molding compounds 3 and 6 soften and the electronic component 1 is leveled with its upper sides and, on account of the earlier solidifying of the plastic package molding compound 6 in comparison with the plastic 3 of the substrate 4, the finished electronic component 1 remains completely planar.

FIG. 4 shows a schematic cross section through an electronic component 1 of a fourth embodiment of the invention. Components with the same functions as in the previous FIGS. are identified by the same reference numerals and are not separately explained.

The fourth embodiment differs from the third embodiment in that exposed conductor tracks of the wiring pattern 9 protrude into the bonding channel opening 19 of the substrate 4 and are connected to the contact areas 17 of the semiconductor chip 2. It is possible by these exposed wiring lines 11 to produce a still flatter component, since no bonding arches are required for bonding wire connections.

The dimensions of the individual components in FIGS. 1 to 4 are in no way true to scale; rather, the thickness of the substrate d is only several 10 s of μm, while the thickness D of the plastic package molding compound 6 is at least 100 μm. The grid dimension R between the external contacts 11 is around 1 mm, while the grid dimension r between the flip-chip contacts of FIG. 1 is around several 10 s of μm.

FIGS. 5 to 9 show results of method steps when simultaneously producing a number of electronic components 1 of embodiments of the invention which are schematically represented in FIGS. 1 to 4. Components with the same functions as in the previous FIGS. are identified by the same reference numerals in FIGS. 5 to 9 and are not separately explained.

FIG. 5 shows the basic diagram of a substrate 4, which is loaded with semiconductor chips 2 and wired. The substrate 4 comprises a plastic 3, which is glass-fiber-reinforced and has a glass transition temperature $T_{g1}$ which lies between 165 and 175° C. The substrate strip 4 has a thickness d of several 10 s of micrometers.

FIG. 6 shows as a basic diagram the application of a molten plastic package molding compound 6 to the not heated-up substrate 4 loaded with semiconductor chips 2 for the production of a panel 23. During the application of the plastic package molding compound 6, which comprises between 60 and 90% filler material, the plastic package molding compound 6 is molten and distributes itself in the mold 27 while embedding the semiconductor chips 2 on the substrate 3 evenly in the mold, in that for example a doctor blade 31, which is identified as a dashed line, is applied to one side of the substrate 4 by means of a screen printing frame 32, pressing the plastic package molding compound 6 through the screen printing frame 32.

Another method provides that the plastic package molding compound 6 is introduced at high pressure into a closed mold 27, the high pressure of an injection-molding machine ensuring that all the cavities between the semiconductor chips 2, the wiring lines and the substrate 4 are filled with a plastic package molding compound. The plastic package molding compound 6 has a glass transition temperature range $T_{g2}$ which is higher than the glass transition temperature range $T_{g1}$ of the substrate.

FIG. 7 shows a basic diagram of the panel 23 after the plastic molding compounds 3 and 6 of the substrate 4 and the plastic package 26 have cooled down, before removal from the printing or casting mold 27. On account of the high coefficient of expansion of the hot plastic package molding compound 6, this plastic molding compound is reduced more in its two-dimensional expansion than the plastic 3 of the not pre-heated substrate 4, with the result that the panel 23 bows, as shown in FIG. 7. The panel 23, which can be removed from the mold 27, consequently does not have planar surfaces and, on the assumption that an acceptable panel 23 may only have minimal deviations from planarity, is considered as scrap.

FIG. 8 shows a basic diagram of the pre-bowed panel 23 after positioning of solder balls 21 on intended positions of the substrate 4. Such solder balls 21 may be applied to the outer side of the substrate 4 with the aid of a vacuum tool after turning over the panel 23, as shown in FIG. 8, each solder ball 21 being kept in position with the aid of the vacuum tool until adhesive flux provisionally fixes the solder ball 23.

FIG. 9 shows a basic diagram of a panel 23 leveled during the melt-soldering of the solder balls 21 to form external contacts 15, for a number of electronic components 1. On account of the temperature during the melt-soldering of the solder balls 21, the panel 21 is leveled on a planar underlying surface (not shown), on account of its own weight, and completely planar electronic components 1 can be formed. The melting temperature is 200 to 250° C. and consequently above the higher glass transition temperature range $T_{g2}$ of the plastic package molding compound 6. After the solder balls 21 have been soldered in to form external contacts 15, the plastic package molding compound 6 is cooled down and is first to pass through the glass transition temperature range $T_{g2}$, before the plastic 3 of the substrate 4, with the result that the plastic package molding compound 6 determines the ultimate shape of the components.

Before separating the now completely planar panel 23 with external contacts 15 into individual electronic components 1, the plastic molding compounds 3 and 6 of the substrate and of the plastic package 26 are subjected to a pre-crosslinking or pre-curing thermal treatment, which in this embodiment of the invention involves renewed heating-up of the panel 23 from room temperature to 90° C. at a heating-up rate of 1° C./min and keeping it at 90° C. for 15 minutes. After the pre-curing, the panel 23 can be transported and further processed as desired. Before the separation into individual electronic components, a final curing is carried out at a temperature of 160° C. for a time of approximately 1 hour. After that, the plastic molding compounds are crosslinked in such a way that the panel 23 can be divided into individual electronic components 1 with the aid of a sawing operation along the separating lines 33. Corresponding profiled saw blades allow a bevel of, for example, 45° to be beveled at the same time onto the four outer edges of the plastic package molding compound 6.

We claim:

1. An electronic component, comprising:
   a substrate formed with plastic;
   a semiconductor chip disposed on said substrate;
   a plastic package molding compound embedding said semiconductor chip; and
   said plastic of said substrate having a glass transition temperature range below a glass transition temperature range of said plastic package molding compound.

2. The electronic component according to claim 1, wherein said plastic of said substrate comprises a glass-fiber-reinforced epoxy resin with a polymer additive.

3. The electronic component according to claim 1, wherein said plastic of said substrate has a glass transition temperature range of between 165° C. and 175° C.

4. The electronic component according to claim 1, wherein the glass transition temperature range of said plastic package molding compound lies above 175° C. and below a decomposition temperature of said plastic package molding compound.

5. The electronic component according to claim 1, wherein said plastic package molding compound comprises from 60 to 90% by volume filling material.

6. The electronic component according to claim 5, wherein said plastic package molding compound comprises from 75 to 85% by volume filling material.

7. The electronic component according to claim 1, wherein said plastic package molding compound has a coefficient of thermal expansion in each of an X, Y and Z direction of a Cartesian coordinate system of between 10 and 60 ppm/° C.

8. The electronic component according to claim 1, wherein said substrate has a coefficient of thermal expansion in each of an X and Y direction of a Cartesian coordinate system of from 5 to 15 ppm/° C. and a coefficient of thermal expansion in a Z direction of between 10 and 60 ppm/° C.

9. The electronic component according to claim 1, wherein a proportion by volume of said substrate in a total volume and a proportion by volume of said plastic package molding compound in the total volume are in a ratio of at least 1 to 3 relative to one another.

10. The electronic component according to claim 1, wherein said substrate carries a wiring pattern, and said semiconductor chip has an active upper side with flip-chip contacts electrically connected to said wiring pattern on said substrate.

11. The electronic component according to claim 1, wherein said substrate has a wiring pattern which has contact terminal areas, wiring lines and contact transition areas to contact vias, the contact vias are connected to external contact areas on an opposite side of said substrate and said external contact areas are formed with external contacts.

12. The electronic component according to claim 11, wherein said external contacts are selected from the group of contacts consisting of solder balls and contact bumps.

13. The electronic component according to claim 11, wherein said external contacts are arranged in rows and columns in a predetermined grid spacing in a two-dimensional matrix.

14. The electronic component according to claim 1, wherein said semiconductor chip has an active upper side a bonding channel region and contact areas in said bonding channel region, said contact areas are connected to bonding fingers of a wiring pattern of said substrate by way of bonding connections in a bonding channel opening of said substrate, and said bonding fingers are connected by way of wiring lines of said wiring pattern to external contact areas, and said external contact areas have external contacts formed thereon.

15. The electronic component according to claim 14, wherein said bonding connections in said bonding channel opening are embedded in said plastic package molding compound.

16. The electronic component according to claim 14, wherein said external contacts are selected from the group of contacts consisting of solder balls and contact bumps.

17. The electronic component according to claim 14, wherein said external contacts are arranged in rows and columns in a predetermined grid spacing in a two-dimensional matrix.

* * * * *